United States Patent
Arakawa et al.

(10) Patent No.: US 10,840,238 B2
(45) Date of Patent: Nov. 17, 2020

(54) SEMICONDUCTOR DEVICE

(71) Applicant: DENSO CORPORATION, Kariya (JP)

(72) Inventors: Takafumi Arakawa, Kariya (JP); Shigeki Takahashi, Kariya (JP)

(73) Assignee: DENSO CORPORATION, Kariya (JP)

( * ) Notice: Subject to any disclaimer, the term of this patent is extended or adjusted under 35 U.S.C. 154(b) by 21 days.

(21) Appl. No.: 16/094,222

(22) PCT Filed: May 24, 2017

(86) PCT No.: PCT/JP2017/019291
§ 371 (c)(1),
(2) Date: Oct. 17, 2018

(87) PCT Pub. No.: WO2017/217198
PCT Pub. Date: Dec. 21, 2017

(65) Prior Publication Data
US 2019/0096878 A1   Mar. 28, 2019

(30) Foreign Application Priority Data

Jun. 14, 2016   (JP) .................................. 2016-118218

(51) Int. Cl.
| | |
|---|---|
| *H01L 27/06* | (2006.01) |
| *H01L 27/07* | (2006.01) |
| *H01L 29/06* | (2006.01) |
| *H01L 29/861* | (2006.01) |
| *H01L 29/78* | (2006.01) |

(Continued)

(52) U.S. Cl.
CPC ...... *H01L 27/0664* (2013.01); *H01L 27/0727* (2013.01); *H01L 29/0619* (2013.01); *H01L 29/0623* (2013.01); *H01L 29/0692* (2013.01); *H01L 29/0696* (2013.01); *H01L 29/1095* (2013.01); *H01L 29/32* (2013.01);
(Continued)

(58) Field of Classification Search
CPC combination set(s) only.
See application file for complete search history.

(56) References Cited

U.S. PATENT DOCUMENTS

| | | |
|---|---|---|
| 2012/0043582 A1 | 2/2012 | Koyama et al. |
| 2013/0087829 A1 | 4/2013 | Tanabe et al. |

(Continued)

FOREIGN PATENT DOCUMENTS

| | | |
|---|---|---|
| JP | 2011-238681 A | 11/2011 |
| JP | 2014-220516 A | 11/2014 |

*Primary Examiner* — Ratisha Mehta
(74) *Attorney, Agent, or Firm* — Posz Law Group, PLC

(57) ABSTRACT

A semiconductor device has a semiconductor substrate including an IGBT region operating as an IGBT provided by an emitter layer, a base layer, a drift layer and a collector layer, and a diode region operating as a diode and provided by an anode layer, the drift layer and a cathode layer. The semiconductor substrate further includes a guard ring of a second conduction type, provided in a surface layer of the drift layer in a peripheral region surrounding a device region where the IGBT region and the diode region are adjacent to each other. The cathode layer and the guard ring are positioned such as to satisfy L/d≥1.5, where L is a minimum value of a distance between the cathode layer and the guard ring as projected to a plane parallel to a surface of the semiconductor substrate, and d is a thickness of the semiconductor substrate.

9 Claims, 5 Drawing Sheets

(51) Int. Cl.
*H01L 29/10* (2006.01)
*H01L 29/32* (2006.01)
*H01L 29/739* (2006.01)

(52) U.S. Cl.
CPC .......... *H01L 29/7397* (2013.01); *H01L 29/78* (2013.01); *H01L 29/8611* (2013.01)

(56) References Cited

U.S. PATENT DOCUMENTS

| | | |
|---|---|---|
| 2014/0084337 A1 | 3/2014 | Matsudai et al. |
| 2014/0361334 A1 | 12/2014 | Tanabe et al. |
| 2016/0315140 A1 | 10/2016 | Iwasaki et al. |
| 2017/0077216 A1 | 3/2017 | Kouno |
| 2017/0162560 A1 | 6/2017 | Takahashi et al. |
| 2017/0263603 A1* | 9/2017 | Hata ................... H01L 29/7397 |

* cited by examiner

10,840,238 B2

SEMICONDUCTOR DEVICE

CROSS REFERENCE TO RELATED APPLICATIONS

This application is a U.S. national phase of International Application No. PCT/JP2017/019291 filed on May 24, 2017 and is based on Japanese Patent Application No. 2016-118218 filed on Jun. 14, 2016, the disclosures of which are incorporated herein by reference.

TECHNICAL FIELD

The present disclosure relates to a semiconductor device having an IGBT (Insulated Gate Bipolar Transistor) and a diode (Free Wheeling Diode) provided on a same semiconductor substrate.

BACKGROUND ART

A semiconductor device having IGBTs and diodes formed on a same semiconductor substrate has been known, as described in Patent Literature 1, for example. In this semiconductor device, the IGBTs and the diodes are formed on the same N-type semiconductor substrate.

More specifically, a P-type base layer is formed in a surface layer on one side of a drift layer that is an N-type semiconductor of a semiconductor substrate, and an emitter layer is selectively formed in the base layer. A P-type collector layer and an N-type cathode layer are formed in a surface layer on the other side of the drift layer. As a result, IGBT regions and diode regions are divided by boundaries between the collector layer and the cathode layer. A plurality of trenches are formed to extend through the base layer and reach the drift layer. Gate electrodes are formed inside the trenches via an insulating film.

The operation in an IGBT region will be described briefly. When a gate electrode in a trench is forward-biased, electrons that are minority carriers are attracted to the base region near the trench so that a channel is formed. When voltage is applied across the collector layer and the emitter layer, with the collector layer being positive, electrons are supplied to the drift layer via the channel from the emitter layer, while holes are supplied to the drift layer from the collector layer. Carriers thus transfer to the drift layer so that collector current flows between the emitter layer and the collector layer.

The operation in a diode region will be described briefly. When a diode is forward-biased, holes supplied from the anode layer (base layer) and electrons supplied from the cathode layer couple to each other in the drift layer, or reach opposite layers so that forward current flows. Conversely, when the diode is reverse-biased, no carrier is supplied into the drift layer so that no current flows.

In the semiconductor device shown in Patent Literature 1 described above, the IGBT regions and the diode regions extend in one direction on the surface of the semiconductor substrate, and are aligned alternately in the direction orthogonal to this extending direction. Namely, the semiconductor device described above is of a type known as an RC-IGBT, having at least a pair of IGBT region and diode region formed on a same substrate.

At least one or more guard rings that are P-type semiconductors are formed around a device region where the IGBT regions and the diode regions are adjacent to each other. The innermost guard ring is in contact with the base layer and electrically connected to the base layer. The guard rings are provided for enhancing the breakdown voltage of the semiconductor device by extending depletion layers formed from the base layer and the anode layer in a direction along the surface of the substrate to reduce the electric field strength when high voltage is applied to the IGBT regions.

PRIOR ART LITERATURE

Patent Literature

Patent Literature 1: JP 2015-185742 A

SUMMARY OF INVENTION

In the diode region, as described above, holes and electrons are supplied to the drift layer respectively from the anode layer (base layer) and the cathode layer in the conducting state in which the diode is forward-biased and current is flowing. When the state is switched from the conducting state to the reverse blocking state being reverse-biased, the carriers accumulated in the drift layer transfer to the base layer and cathode layer from which they were supplied, causing a large transient current (recovery current) to flow in reverse direction, which is called recovery phenomenon.

When the base layer and the innermost guard ring are electrically connected to each other as in the semiconductor device of Patent Literature 1, the potential of the guard ring is equal to that of the base layer when the diode is forward-biased. Therefore, holes are provided to the drift layer also from the guard ring that is a P-type semiconductor. Namely, when the diode is forward-biased, holes supplied from the base layer and the guard ring, and electrons supplied from the cathode layer are accumulated in the drift layer.

Therefore, there exist more holes in the drift region near the boundary between the diode and the guard ring as compared to central parts or elsewhere of the diode by the amount of holes supplied from the guard ring. Accordingly, when the recovery phenomenon occurs, the large amount of holes near the boundary between the diode and the guard ring flow into the anode layer of the diode at once, causing current concentration. Such local current concentration may possibly limit the peak reverse recovery current (peak recovery current) of the diode.

In the semiconductor device of Patent Literature 1, a damaged region is formed in the diode region as well as in a peripheral region so as to suppress hole injection from the guard ring in the peripheral region into the diode region. However, the effect of reducing the amount of hole injection is limited, since the damaged region extending from the diode region to the peripheral region covers only part of the guard ring.

It is an object of the present disclosure to provide a semiconductor device capable of further increasing the peak recovery current of diodes.

According to an aspect of the present disclosure, a semiconductor device has a semiconductor substrate including: a drift layer of a first conduction type; a base layer and an anode layer of a second conduction type provided in a surface layer on one side of the drift layer; an emitter layer selectively provided in the base layer; and a collector layer of a second conduction type and a cathode layer of a first conduction type provided in a surface layer on the other side of the drift layer. The emitter layer, the base layer, the drift layer, and the collector layer provide an IGBT region that operates as an IGBT. The anode layer, the drift layer, and the cathode layer provide a diode region that operates as a diode adjacent to the IGBT region.

The semiconductor substrate further includes a guard ring of a second conduction type. The guard ring is provided in a surface layer of the drift layer in a peripheral region surrounding a device region where the IGBT region and the diode region are adjacent to each other. The guard ring is applied with voltage having a same potential as that of the anode layer.

The cathode layer and the guard ring are positioned such as to satisfy L/d≥1.5, where L is a minimum value of a distance between the cathode layer and the guard ring as projected to a plane parallel to a surface of the semiconductor substrate, and d is a thickness of the semiconductor substrate.

According to the aspect of the present disclosure, the positional relationship between the cathode layer and the guard ring is set such as to satisfy L/d≥1.5, so that carriers are conducted more easily between the anode layer and the cathode layer than between the guard ring and the cathode layer, when the diode region is forward-biased. In other words, carrier conduction between the anode layer and the cathode layer becomes dominant in the diode region.

The ratio of carriers injected from the guard ring to the drift layer to carriers injected from the anode layer to the drift layer is reduced. Thus, accumulation of a large amount of carriers in the drift layer near the boundary between the anode layer and the guard ring can be minimized. Accordingly, a flow of a large amount of holes into the anode layer, i.e., local current concentration, when the diode region is switched to reverse bias, can be suppressed. Thus, the peak recovery current of the diode can be increased further.

BRIEF DESCRIPTION OF DRAWINGS

The above and other objects, features and advantages of the present disclosure will become more apparent from the following detailed description made with reference to the accompanying drawings, in which.

DESCRIPTION OF EMBODIMENTS

Figure 1:
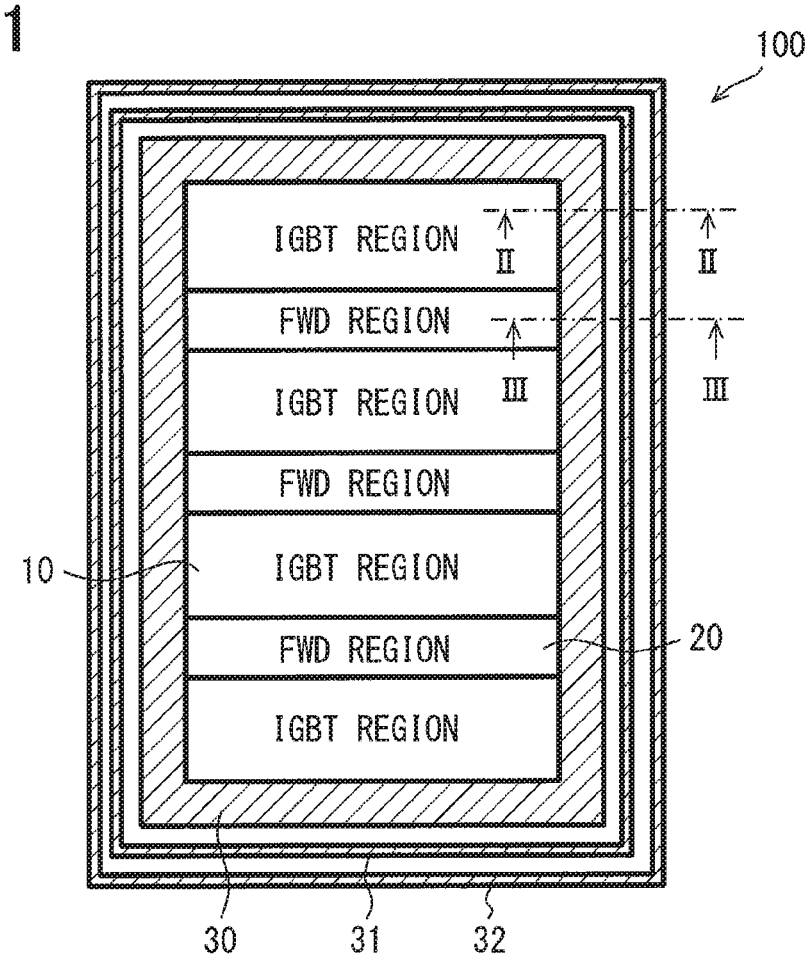
FIG. 1 is a top plan view of a semiconductor device according to a first embodiment.

Hereinafter, embodiments of the present disclosure will be described with reference to the drawings. Same or equivalent parts in the drawings described below are given the same reference numerals.

First Embodiment

First, a schematic configuration of a semiconductor device according to a first embodiment will be described with reference to FIG. 1 to FIG. 3.

Figure 2:
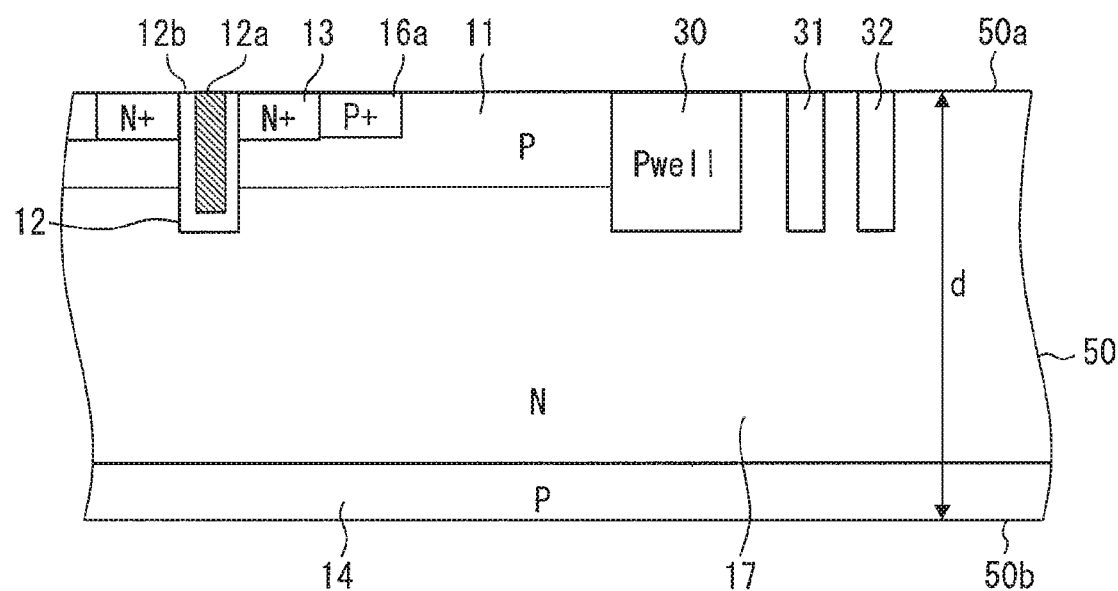
FIG. 2 is a longitudinal cross-sectional view along line II-II in FIG. 1 illustrating the configuration of an IGBT region.

As shown in FIG. 1 and FIG. 2, the semiconductor device 100 is a reverse conducting IGBT (RC-IGBT) having IGBT regions 10 and diode regions 20 formed on one semiconductor substrate 50. The IGBT regions 10 and diode regions 20 extend in one direction on the surface of the semiconductor substrate 50 in stripes as shown in FIG. 1, and are alternately aligned in a direction orthogonal to their extending direction.

A region in which IGBT regions 10 and diode regions 20 are alternately adjacent to each other forms a device region. Guard rings 30, 31, and 32 made of a P-type semiconductor are formed in a peripheral region surrounding the device region. For ease of understanding, hatching is provided to the three guard rings 30, 31, and 32 in FIG. 1. While FIG. 1 shows three guard rings 30, 31, and 32 as one example, the number of guard rings 30, 31, and 32 may be at least one or more.

The guard rings 30, 31, and 32 are provided for enhancing the breakdown voltage of the semiconductor device 100 by extending depletion layers formed from a base layer 11 and an anode layer 21 in a direction along the surface of the semiconductor substrate 50 to reduce the electric field strength when high voltage is applied to the IGBT regions 10.

In the device region, IGBT regions 10 are provided at both ends of the array of IGBT regions 10 and diode regions 20. Therefore, as will be described in more detail later, countermeasures against carrier (hole) injection from the guard ring 30 into the drift layer 17 of diode regions 20 need only be provided near side portions of the diode regions 20 parallel to the array direction.

FIG. 2 is a cross-sectional view illustrating the configuration of an IGBT region 10 of the semiconductor device 100. As shown in FIG. 2, the semiconductor device 100 generally includes a base layer 11, a trench gate electrode 12a, an emitter layer 13, and a collector layer 14 in the IGBT region 10. Reference numeral 16a denotes a base contact layer.

Figure 3:
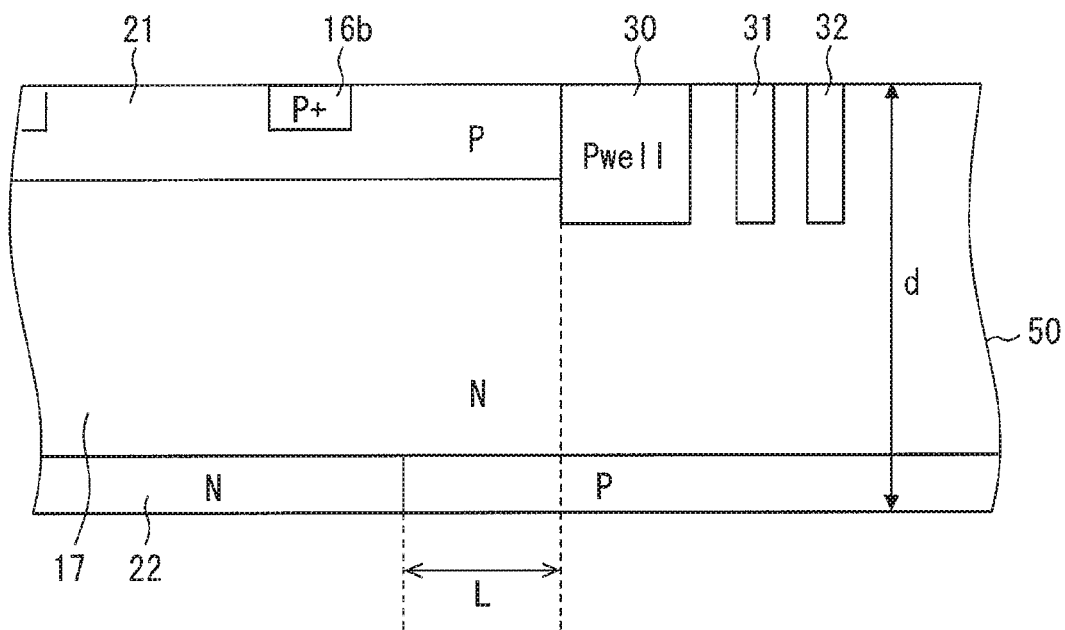
FIG. 3 is a longitudinal cross-sectional view along line III-III in FIG. 1 illustrating the configuration of a diode region.

FIG. 3 is a cross-sectional view illustrating the configuration of a diode region 20 of the semiconductor device 100. As shown in FIG. 3, the semiconductor device 100 includes an anode layer 21 and a cathode layer 22 in the diode region 20. Reference numeral 16b denotes an anode contact layer. The innermost guard ring 30 is in contact with the anode layer 21 and electrically connected to the anode layer 21.

The base layer 11 and anode layer 21 have a surface impurity concentration of 3E17 ($3\times10^{17}/cm^3$), for example, and are formed at a depth of 2.5 µm, for example. The guard ring 30 has a surface impurity concentration of 4E17 ($4\times10^{17}/cm^3$), for example, and is formed at a depth of 7.0 µm, for example. The guard ring 30 therefore has a higher impurity concentration than that of the base layer 11 and anode layer 21. Also, the guard ring 30 is formed deeper than the anode layer 21.

A drift layer 17 is formed in each of the IGBT regions 10 and diode regions 20, respectively between the base layer 11 and the collector layer 14, and between the anode layer 21 and the cathode layer 22.

The semiconductor substrate 50 has N-type conductivity, with impurities doped in the silicon. The semiconductor substrate 50 has an impurity concentration of 1E14, for example. The semiconductor substrate 50 is cut out from a silicon wafer, and has a first main surface 50a and a second main surface 50b that is the backside of the first main surface. The IGBT regions 10 and diode regions 20 are built in each of the main surfaces 50a and 50b of the semiconductor substrate 50 by ion implantation.

The base layer 11 is formed in a surface layer of the first main surface 50a of the semiconductor substrate 50 in each IGBT region 10. The base layer 11 has P-type conductivity, doped with boron as the impurity, for example.

In the IGBT regions 10, when voltage of a predetermined level is applied to the trench gate electrode 12a formed in the trench 12 via an insulating film 12b, the base layer 11 creates a channel in a surface layer portion around the trench. Collector current flows between the emitter layer 13 and the collector layer 14 via this channel.

More specifically, electrons are supplied from the emitter layer 13 via the channel to the drift layer 17, while holes are supplied from the collector layer 14 to the drift layer 17. As the emitter layer 13 and collector layer 14 supply respective carriers to the drift layer 17, collector current flows between the emitter layer 13 and the collector layer 14.

The trench 12 extends in the depth direction of the semiconductor substrate 50 from the first main surface 50a through the base layer 11 as far as to reach the drift layer 17. The trench gate electrode 12a is formed from polysilicon used to fill the trench 12 after covering the inner walls of the trench 12 cut into the first main surface 50a of the semiconductor substrate 50 with the insulating film 12b. The trench gate electrode 12a is connected to gate terminals of the IGBT regions 10, which are control terminals, and used for the switching control of the IGBTs.

The emitter layer 13 is selectively formed in the surface layer of the first main surface 50a. More specifically, the emitter layer 13 is formed around the trenches 12 in the IGBT regions 10. The emitter layer 13 has N-type conductivity, doped with arsenic and phosphorus as the impurities, for example. The emitter layer 13 is formed at a smaller depth than that of the base layer 11, and the emitter layer 13 is covered by the base layer 11. The emitter layer 13 is connected to emitter terminals of the IGBT regions 10, which are output terminals, and have ground potential, for example.

The collector layer 14 is formed in a surface layer of the second main surface 50b in each IGBT region 10. The collector layer 14 has P-type conductivity, doped with boron as the impurity, for example. The collector layer 14 has a higher impurity concentration than that of the base layer 11. The collector layer 14 is connected to collector terminals of the IGBT regions 10, which are output terminals, to allow collector current to flow between the collector layer and the emitter layer 13.

The anode layer 21 is formed in a surface layer of the first main surface 50a of the semiconductor substrate 50 in each diode region 20. The anode layer 21 has P-type conductivity, doped with boron as the impurity, for example. The anode layer 21 is formed in the same process of forming the base layer 11 of the IGBT regions 10 so that the base layer 11 and anode layer 21 are continuous. Thus, the depth of the anode layer 21 from the first main surface 50a and the impurity concentration are the same as those of the base layer 11. The anode layer 21 forms a PN junction between itself and the cathode layer 22 and the drift layer 17 to provide the diode functions.

The cathode layer 22 is formed in a surface layer of the second main surface 50b in each diode region 20. The cathode layer 22 has N-type conductivity, doped with arsenic and phosphorus as the impurities, for example. The cathode layer 22 has a higher impurity concentration than that of the semiconductor substrate 50 (drift layer 17).

The base contact layer 16a and the anode contact layer 16b are both P-type conductivity semiconductor regions having higher impurity concentrations than those of the base layer 11 and anode layer 21, respectively. These contact layers 16 are used for connection with interconnects (not shown). In particular, the anode contact layer 16b removes holes accumulated in the drift layer 17 efficiently when the diode regions 20 change from the forward-biased to reverse-biased state.

The drift layer 17 is a region defined by providing the base layer 11, the collector layer 14, the anode layer 21, and the cathode layer 22 to the semiconductor substrate 50. More specifically, it is a region between the base layer 11 and the collector layer 14, and between the anode layer 21 and the cathode layer 22. Not to mention, it has N-type conductivity and the same impurity concentration as that of the semiconductor substrate 50.

As described above, the semiconductor device 100 according to this embodiment has guard rings 30, 31, and 32 having a high impurity concentration in the peripheral region, and the innermost guard ring 30 is electrically connected to the anode layer 21 of the diode regions 20. Therefore, when the diode regions 20 are forward-biased, carriers (holes) are supplied to the drift layer 17 not only from the anode layer 21 but also from the guard ring 30. Consequently, there exist more holes in the drift layer 17 near the boundaries between the diode regions 20 and the guard ring 30 as compared to central parts or elsewhere of the diode regions 20 by the amount of holes supplied from the guard ring 30.

When the diode regions 20 are switched from the forward-biased to reverse-biased state, the large amount of holes near the boundaries between the diode regions 20 and the guard ring 30 may flow to the anode layer 21 of the diode regions 20 at once, causing current concentration.

The semiconductor device 100 according to this embodiment minimizes such current concentration by a devised positional relationship between the cathode layer 22 and the guard ring 30 in each diode region 20. The technical features of the semiconductor device 100 according to this embodiment will be described in more detail below.

Figure 4:
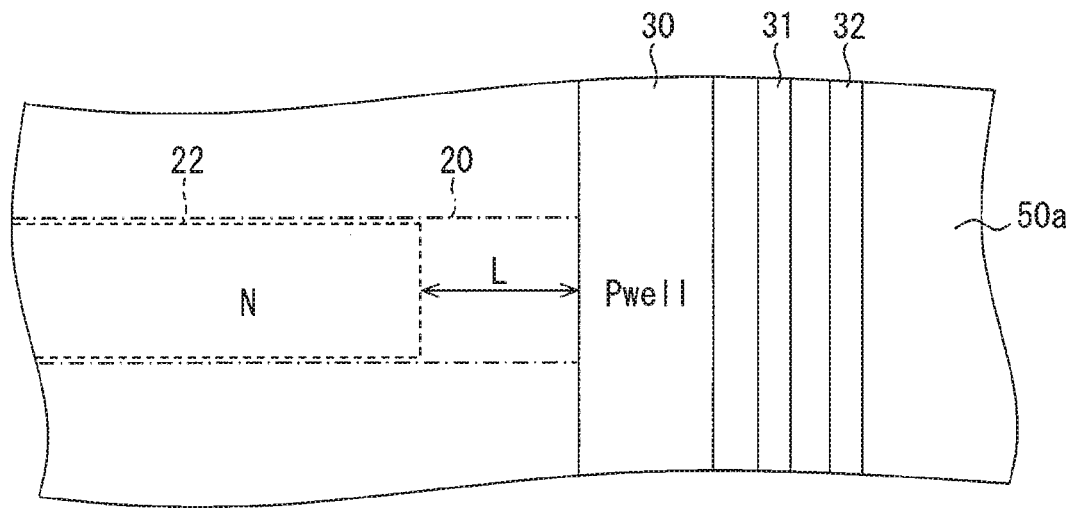
FIG. 4 is a top plan view for illustrating the positional relationship between a cathode layer and a guard ring in the diode region.
Figure 5:
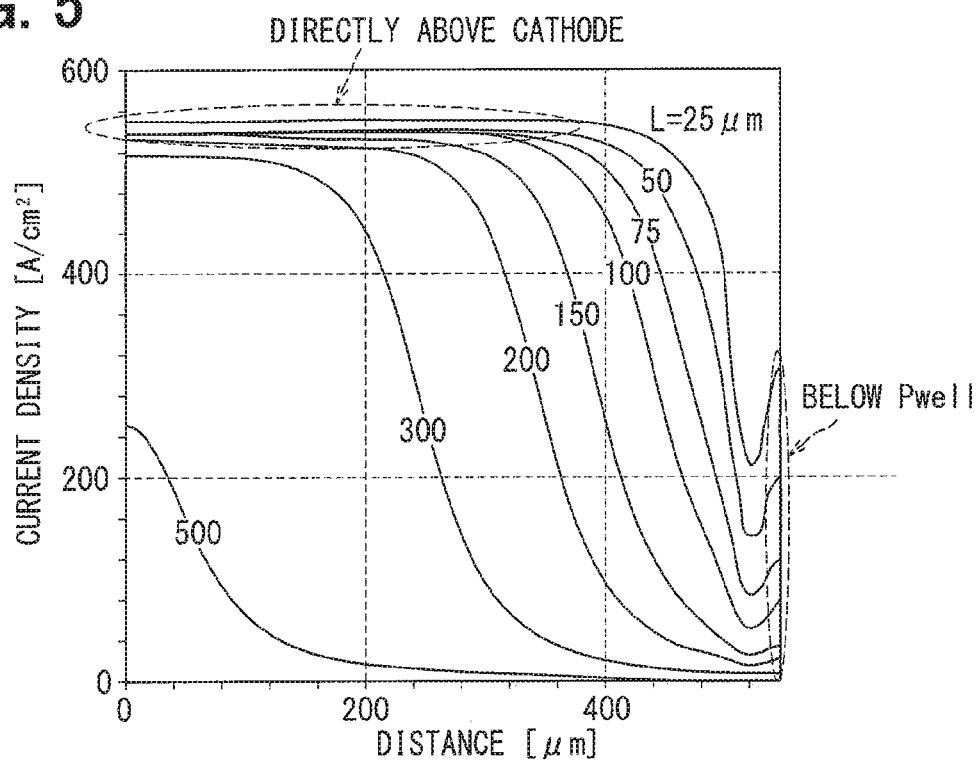
FIG. 5 is a graph showing how a current density changes at a depth in a drift layer deeper than the guard ring when the minimum distance L between the cathode layer and the guard ring in the diode region is varied.

First, using simulation models, it was ascertained how a current density would change in the drift layer 17 at a position deeper than that of the guard ring 30 (e.g., 15 µm), when the minimum distance L between the cathode layer 22 and the guard ring 30, as projected onto a plane parallel to the surface of the semiconductor substrate 50 having a constant thickness (e.g., 75 µm) as shown in FIG. 3 and FIG. 4 was varied. The results are shown in the graph of FIG. 5.

It can be seen from the graph of FIG. 5 that, the shorter the minimum distance L between the cathode layer 22 and the guard ring 30 as projected onto a plane parallel to the surface of the semiconductor substrate 50, the higher the current density directly below a Pwell region, which forms the innermost guard ring 30. On the other hand, it is also confirmed that the current density directly above the cathode layer 22 converges to a substantially constant value irrespective of the minimum distance L.

It is assumed from this result that, the shorter the minimum distance L between the cathode layer 22 and the guard ring 30, the more carriers are injected from the guard ring 30 to the drift layer 17, resulting in the high current density directly below the guard ring 30 (Pwell region).

Figure 6:
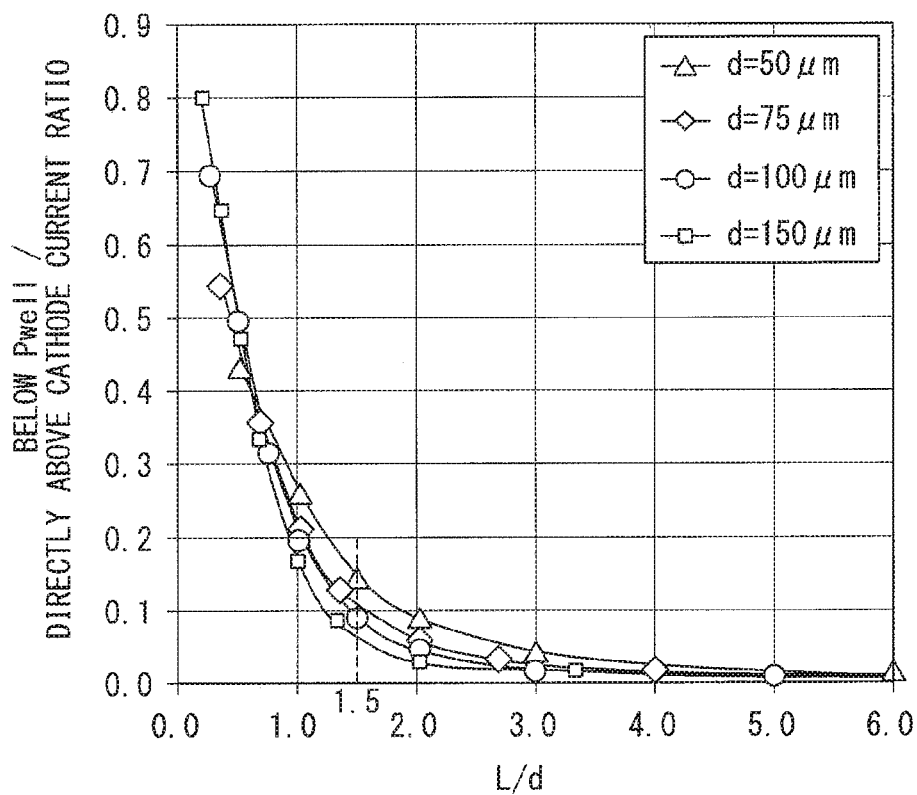
FIG. 6 is a graph showing the relationship between the ratio of the minimum distance L between the cathode layer and the guard ring to the substrate thickness d, and the ratio of current below a Pwell region to current directly above the cathode layer, when the thickness of the semiconductor substrate is varied.

Furthermore, using simulation models, the thickness d of the semiconductor substrate 50 was varied, and it was ascertained how a current density would change at a position deeper than that of the guard ring 30 (e.g., 15 μm), when the minimum distance L between the cathode layer 22 and the guard ring 30 was varied for each of the substrate thicknesses d. The results obtained for each of the substrate thicknesses d were plotted on the graph as shown in FIG. 6, with one axis representing L/d (L: minimum distance, d: substrate thickness), and the other axis representing the ratio of current below the Pwell region to current directly above the cathode layer. As shown in the graph of FIG. 6, the substrate thickness d was 50 μm, 75 μm, 100 μm, and 150 μm.

It can be seen from the graph of FIG. 6 that, irrespective of the thickness of the semiconductor substrate 50, the magnitude of current (current density) below the guard ring 30 (Pwell region) reduces relative to the magnitude of current (current density) directly above the cathode layer 22, as the value L/d increases. This is considered to be because the larger the value L/d is, the more easily carriers are conducted between the anode layer 21 and the cathode layer 22 than between the guard ring 30 and the cathode layer 22, when the diode regions 20 are forward-biased. In other words, carrier conduction between the anode layer 21 and the cathode layer 22 becomes dominant in the diode regions 20.

As shown in the graph of FIG. 6, irrespective of the thickness of the semiconductor substrate 50, the ratio of current below the Pwell region to current directly above the cathode layer declines rapidly as the value L/d increases, in the range where the value L/d is smaller than 1 until L/d exceeds 1. The ratio of current below the Pwell region to current directly above the cathode layer reduces to as low as less than about 0.15 when the value L/d is around 1.5. After that, the gradient of change in the ratio of current below the Pwell region to current directly above the cathode layer with the increase in the value L/d becomes smaller. Namely, from the graph of FIG. 6, it can be said that there is a flexion point near L/d=1.5 in the relationship between L/d and the ratio of current below the Pwell region to current directly above the cathode layer.

When the ratio of current below the Pwell region to current directly above the cathode layer is less than about 0.15, the amount of carriers injected from the guard ring 30 to the drift layer 17 is about ⅙ to ⅐ at most of the carriers injected from the anode layer 21. With this amount of carrier injection, the concentration of recovery current near the boundaries between the diode regions 20 and the guard ring 30 can be reduced to a practical level.

Based on these results, the cathode layer 22 and guard ring 30 are positioned such as to satisfy L/d≥1.5, in this embodiment. Therefore, in this embodiment, both end faces of the cathode layer 22 parallel to the array direction of the IGBT regions 10 and diode regions 20 terminate at positions spaced apart from the guard ring 30 by the minimum distance L as shown in FIG. 4.

Thus, accumulation of a large amount of holes in the drift layer 17 near the boundaries between the anode layer 21 and the guard ring 30 can be minimized. Accordingly, a flow of a large amount of holes into the anode layer 21, i.e., local current concentration, when the diode regions 20 are switched to reverse bias, can be prevented from occurring. Thus, the peak recovery current of the diode regions 20 can be increased further.

More preferably, the cathode layer 22 and guard ring 30 should be positioned such as to satisfy L/d≥1.8. This is because, if the positional relationship between the cathode layer 22 and the guard ring 30 satisfies L/d≥1.8, the ratio of current below the Pwell region to current directly above the cathode layer is reduced to less than about 0.1, as can be seen from the graph of FIG. 6. It is even more preferable if the cathode layer 22 and the guard ring 30 are positioned such as to satisfy L/d≥2.0, since it can be ensured that the ratio of current below the Pwell region to current directly above the cathode layer is below 0.1.

Second Embodiment

Next, a semiconductor device according to a second embodiment will be described.

In the semiconductor device 100 according to the first embodiment described above, no lattice defect layer (damaged layer) is formed in the drift layer 17. However, there may be formed a lattice defect layer as with conventional semiconductor devices. In this embodiment, the positional relationship between a cathode layer 22 and a guard ring 30 when there is provided a lattice defect layer will be described.

Figure 7:
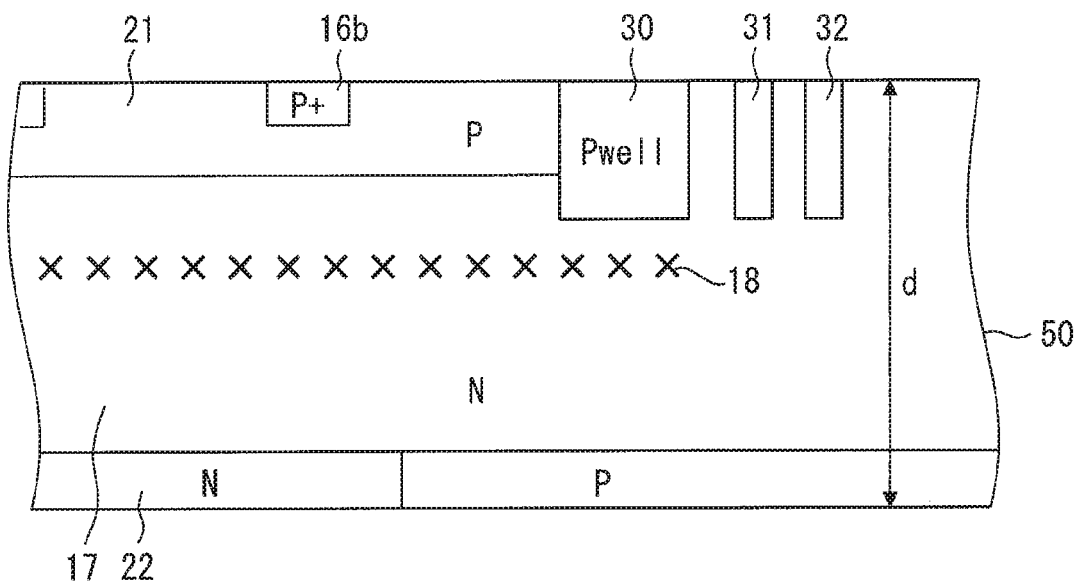
FIG. 7 is a longitudinal cross-sectional view illustrating the configuration of a diode region of a semiconductor device according to a second embodiment.

A lattice defect layer 18 formed in a drift layer 17 as shown in FIG. 7 can shorten the lifetime of carriers moving in the drift layer 17, whereby the amount of carriers accumulated in the drift layer 17 can be adjusted.

The lattice defect layer 18 is formed by inducing lattice damage in the crystalline structure in a semiconductor substrate 50 by ion irradiation. Examples of ion species with which the semiconductor substrate 50 is irradiated include protons, helium ions, and argon ions.

Figure 8:
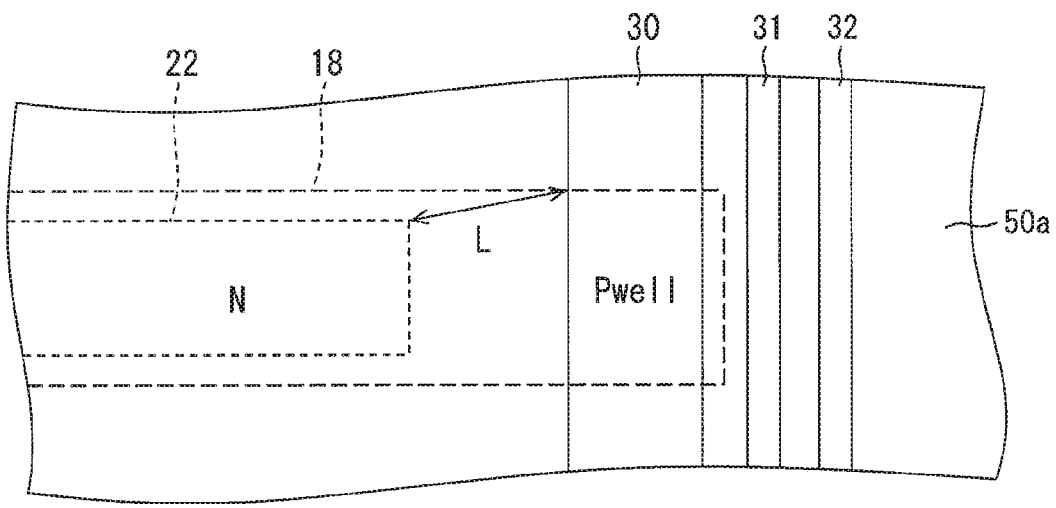
FIG. 8 is a top plan view for illustrating an example of positional relationship between a cathode layer and a guard ring in the diode region in the second embodiment.

The lattice defect layer 18 here is formed to cover the diode regions 20 in the drift layer 17 and as far as to reach the drift layer 17 of the peripheral region, as shown in FIG. 7 and FIG. 8, for example. As the lattice defect layer 18 extends as far as to the peripheral region, the amount of carriers injected into the drift layer 17 from part of the guard ring 30 covered by the lattice defect layer 18 can be reduced.

However, carriers could be supplied to the drift layer 17 from end portions of the guard ring 30 that are not covered by the lattice defect layer 18 as projected to the first main surface 50a of the semiconductor substrate 50 as shown in FIG. 8 when the diode region 20 is forward-biased. This may result in local accumulation of a large amount of carriers in the drift layer 17 despite the lattice defect layer 18.

Figure 9:
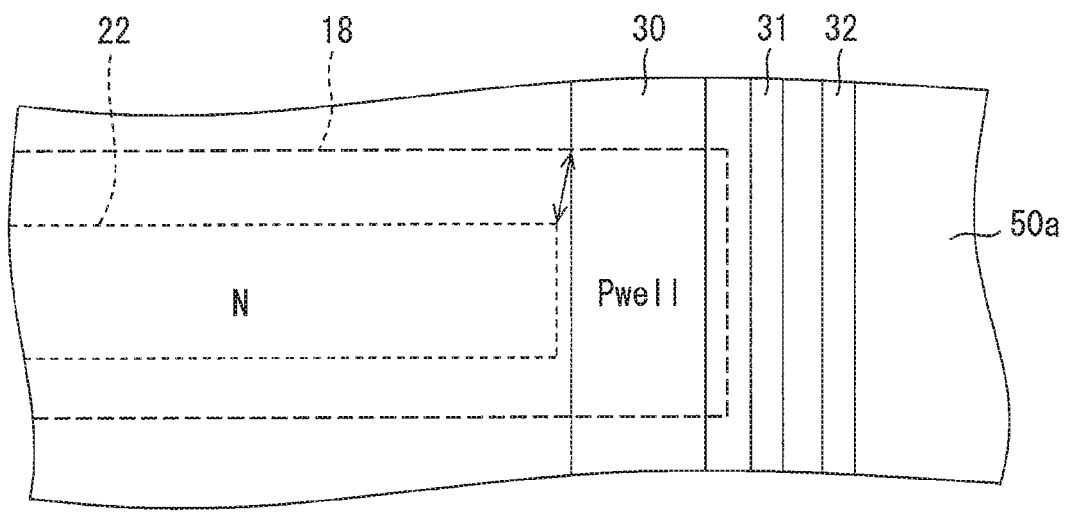
FIG. 9 is a top plan view for illustrating another example of positional relationship between the cathode layer and the guard ring in the diode region in the second embodiment.

Therefore, in the semiconductor device 100 according to the second embodiment, the cathode layer 22 and part of the guard ring 30 not covered by the lattice defect layer 18 are positioned such as to satisfy L/d≥1.5. More specifically, the cathode layer 22 is terminated at a position spaced from the guard ring 30 as shown in FIG. 8, or the width of the lattice defect layer 18 is increased as shown in FIG. 9, so that there is as long a distance as possible between the cathode layer 22 and part of the guard ring 30 not covered by the lattice defect layer 18.

In this embodiment, too, similarly to the first embodiment, the positional relationship between the cathode layer 22 and the guard ring 30 should preferably satisfy $L/d \geq 1.8$, and more preferably $L/d \geq 2.0$.

By employing the configuration described above, when there is provided a lattice defect layer 18, injection of a large amount of carriers from parts of the guard ring 30 not covered by the lattice defect layer 18 can be minimized.

(Modification)

Figure 10:
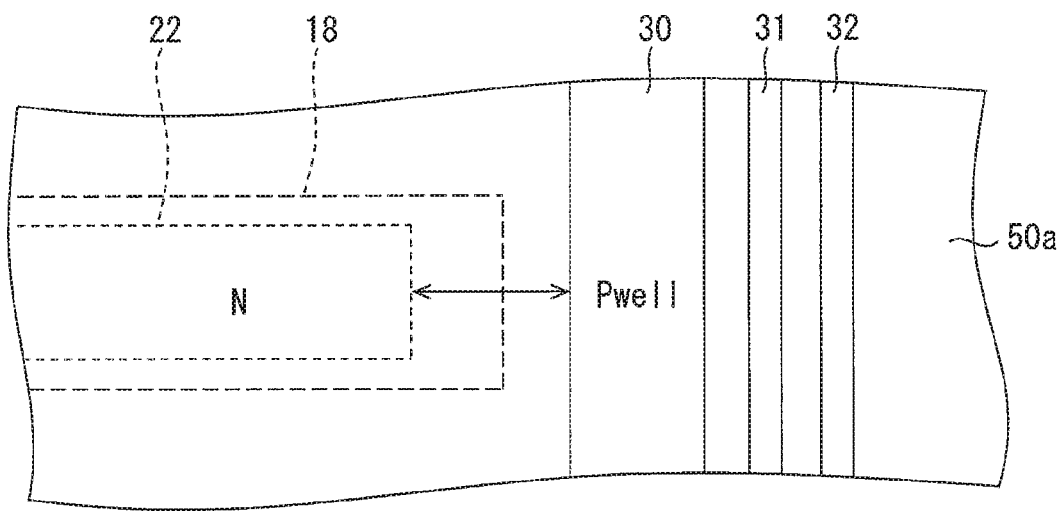
FIG. 10 is a top plan view for illustrating an example of positional relationship between a cathode layer and a guard ring in a diode region according to a modification.

The lattice defect layer 18 may not extend as far as to reach the peripheral region as shown in FIG. 10. In this case, the guard ring 30 is not covered by the lattice defect layer 18, and therefore, the cathode layer 22 and the guard ring 30 may be positioned relative to each other such as to satisfy $L/d \geq 1.5$, where L is the minimum distance between an end of the cathode layer 22 and the guard ring 30, as has been described in the first embodiment.

While examples of substrate concentration, surface concentration of the base layer 11 and anode layer 21, and surface concentration of the guard ring 30 have been shown in the embodiments described above, these values are only examples. This applies also to the depths of the base layer 11 and the anode layer 21, or the depth of the guard ring 30.

For example, on condition that the surface concentration of the guard ring 30 is larger than the surface concentrations of the base layer 11 and anode layer 21, the surface concentration of the base layer 11 and the anode layer 21 may be selected from the range of from 1E17 to 8E17, and the surface concentration of the guard ring 30 may be selected from the range of from 2E17 to 1E18. Similarly, the depth of the base layer 11 and the anode layer 21 may be selected from the range of from 2 μm to 4 μm, and the depth of the guard ring 30 may be selected from the range of from 6 μm to 8 μm. The substrate concentration may be selected from the range of from 5E13 to 2E14. This is because the ratio of current below the Pwell region to current directly above the cathode layer described above will not change largely with such ranges of variations in concentration or depth.

Although the present disclosure is described based on the above embodiments, the present disclosure is not limited to the embodiments and the structures. Various changes and modification may be made in the present disclosure. Furthermore, various combination and formation, and other combination and formation including one, more than one or less than one element may be made in the present disclosure.

The invention claimed is:

1. A semiconductor device, comprising a semiconductor substrate including:
    a drift layer of a first conduction type;
    a base layer and an anode layer of a second conduction type provided in a surface layer on one side of the drift layer;
    an emitter layer selectively provided in the base layer; and
    a collector layer of the second conduction type and a cathode layer of the first conduction type provided in a surface layer on the other side of the drift layer,
    the emitter layer, the base layer, the drift layer, and the collector layer providing an IGBT region that operates as an IGBT, and the anode layer, the drift layer, and the cathode layer providing a diode region that operates as a diode adjacent to the IGBT region, wherein:
    the semiconductor substrate further includes a guard ring of the second conduction type, the guard ring being provided in a surface layer of the drift layer in a peripheral region surrounding a device region where the IGBT region and the diode region are adjacent to each other, and the guard ring being applied with voltage having a same potential as the anode layer; and
    the cathode layer and the guard ring are positioned such as to satisfy $L/d \geq 1.5$, where L is a minimum value of a distance between the cathode layer and the guard ring as projected to a plane parallel to a surface of the semiconductor substrate, and d is a thickness of the semiconductor substrate.

2. The semiconductor device according to claim 1, wherein
    a damaged region is provided in the drift layer at least included in the diode region,
    the damaged region extends beyond the device region to reach the drift layer of the peripheral region, and
    the cathode layer and part of the guard ring not covered by the damaged region are positioned such as to satisfy $L/d \geq 1.5$, where L is a minimum value of a distance between the cathode layer and the part of the guard ring not covered by the damaged region as projected to the plane parallel to the surface of the semiconductor substrate, and d is the thickness of the semiconductor substrate.

3. The semiconductor device according to claim 1, wherein
    the cathode layer and the guard ring are positioned such as to satisfy $L/d \geq 1.8$.

4. The semiconductor device according to claim 1, wherein
    the cathode layer and the guard ring are positioned such as to satisfy $L/d \geq 2.0$.

5. The semiconductor device according to claim 1, wherein
    the guard ring has a higher impurity concentration than the anode layer.

6. The semiconductor device according to claim 1, wherein
    the device region includes a plurality of the IGBT regions and the diode regions alternately aligned in striped array, and
    the IGBT regions are positioned at both ends of the striped array of the device region.

7. The semiconductor device according to claim 1, further comprising
    an anode contact layer of the second conduction type provided in a surface portion of the anode layer, having a higher impurity concentration than an impurity concentration of the anode layer, and located directly above the cathode layer, wherein
    the anode contact layer is separated from the guard ring.

8. The semiconductor device according to claim 7, further comprising
    a base contact layer of the second conduction type provided in a surface portion of the base layer, having a higher impurity concentration than an impurity concentration of the base layer, wherein
    the base contact layer is separated from the guard ring.

9. The semiconductor device according to claim 1, further comprising:
    an anode contact layer of the second conduction type provided in a surface portion of the anode layer, having a higher impurity concentration than an impurity concentration of the anode layer, and located directly above the cathode layer; and
    a base contact layer of the second conduction type provided in a surface portion of the base layer, and having a higher impurity concentration than an impurity concentration of the base layer.

\* \* \* \* \*